(12) United States Patent
Chiang et al.

(10) Patent No.: US 6,365,325 B1
(45) Date of Patent: Apr. 2, 2002

(54) APERTURE WIDTH REDUCTION METHOD FOR FORMING A PATTERNED PHOTORESIST LAYER

(75) Inventors: Min-Hsiung Chiang, Taipei; Huan-Just Lin, Hsin-Chu; James Cheng-Ming Wu, Kao-Hsiung; Cheng-Tung Lin, Taichung, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/247,791

(22) Filed: Feb. 10, 1999

(51) Int. Cl.$^7$ .................................. G03C 5/00
(52) U.S. Cl. ................... 430/313; 430/318; 430/330
(58) Field of Search ................ 430/313, 318, 430/330; 438/669, 673, 698, 759, 760

(56) References Cited

U.S. PATENT DOCUMENTS

| | | | | |
|---|---|---|---|---|
| 4,022,932 A | * | 5/1977 | Feng | 427/93 |
| 5,096,802 A | | 3/1992 | Hu | 430/328 |
| 5,320,932 A | | 6/1994 | Haraguchi et al. | 430/312 |
| 5,744,284 A | * | 4/1998 | Laub et al. | 430/313 |
| 5,763,324 A | | 6/1998 | Nogami | 438/675 |
| 6,043,001 A | * | 3/2000 | Hirsh et al. | 430/321 |

* cited by examiner

Primary Examiner—Mark F. Huff
Assistant Examiner—Saleha R. Mohamedulla
(74) Attorney, Agent, or Firm—George O. Saile; Stephen B. Ackerman; Stephen G. Stanton

(57) ABSTRACT

A method for fabricating a microelectronic layer. There is first provided a substrate. There is then formed over the substrate a target layer. There is then formed upon the target layer a patterned photoresist layer which defines a first aperture, where the first aperture has a first aperture width which exposes a first portion of the target layer. There is then reflowed thermally the patterned photoresist layer to form a reflowed patterned photoresist layer which defines a substantially straight sided second aperture. The second aperture has a second aperture width less than the first aperture width, and the second aperture thus exposes a second portion of the blanket target layer of areal dimension less than the first portion of the blanket target layer. Finally, there is then fabricated the target layer to form a fabricated target layer while employing the reflowed patterned photoresist layer as a mask layer. The method is useful insofar as it allows the target layer to be fabricated while avoiding the use of advanced microelectronic fabrication photolithographic tooling when forming the patterned photoresist layer.

46 Claims, 1 Drawing Sheet

APERTURE WIDTH REDUCTION METHOD FOR FORMING A PATTERNED PHOTORESIST LAYER

BACKGROUND OF THE INVENTION

1. Field of the Invention

The present invention relates generally to methods for fabricating microelectronic structures and microelectronic layers within microelectronic fabrications. More particularly, the present invention relates to methods for fabricating with reduced dimension microelectronic structures and microelectronic layers within microelectronic fabrications.

2. Description of the Related Art

Microelectronic fabrications are formed from microelectronic substrates over which are formed patterned microelectronic conductor layers which are separated by microelectronic dielectric layers.

As microelectronic fabrication integration levels have increased, it has become increasingly important within the art of microelectronic fabrication to form microelectronic device structures and patterned microelectronic layers, such as but not limited to patterned microelectronic conductor layers, with continuing decreased dimensions such that increased microelectronic fabrication functionality, which is typically realized incident to increased microelectronic fabrication integration, may be effected with limited, if any, increase in overall microelectronic fabrication package size.

While continued decreases in dimension of microelectronic device structures and patterned microelectronic layers are thus essential within the fabrication of advanced microelectronic fabrications, such decreases in dimensions of microelectronic device structures and patterned microelectronic layers are often not obtained entirely without problems within the art of microelectronic fabrication. In that regard, it is often difficult to provide decreased dimensions of microelectronic device structures and patterned microelectronic layers, such as, in particular, patterned microelectronic conductor stud layers, within microelectronic fabrications without incurring expenditure for advanced microelectronic fabrication tooling, in particular advanced microelectronic fabrication photolithographic tooling.

It is thus towards the goal of forming within microelectronic fabrications microelectronic device structures and patterned microelectronic layers with decreased dimensions without employing advanced microelectronic fabrication tooling, in particular advanced microelectronic fabrication photolithographic tooling, that the present invention is directed.

Various methods have been disclosed in the art of microelectronic fabrication for forming microelectronic device structures and patterned microelectronic layers with desirable properties within microelectronic fabrications.

For example, Ho, in U.S. Pat. No. 5,096,802, discloses a method for reducing feature width of a microelectronic device structure or patterned microelectronic layer within a microelectronic fabrication while not employing advanced microelectronic fabrication photolithographic tooling when forming a patterned positive photoresist layer which is employed in fabricating the microelectronic device structure or patterned microelectronic layer within the microelectronic fabrication. The method employs, when forming the patterned microelectronic device structure or patterned microelectronic layer, a high temperature reflow of the patterned positive photoresist layer employed for forming the microelectronic device structure or patterned microelectronic layer to form a reflowed patterned photoresist layer, followed by an ultraviolet stabilization of the reflowed patterned positive photoresist layer to form an ultraviolet stabilized reflowed patterned positive photoresist layer having a narrower aperture width than the patterned positive photoresist layer. The ultraviolet stabilized reflowed patterned positive photoresist layer is then employed for fabricating a microelectronic device structure or patterned microelectronic layer from a microelectronics layer formed beneath the ultraviolet stabilized reflowed patterned positive photoresist layer within the microelectronic fabrication.

In addition, Haraguchi et al., in U.S. Pat. No. 5,320,932, discloses a method for forming within a microelectronics fabrication, while employing a single photoexposed blanket photoresist layer as an etch mask layer, a series of vias through a microelectronics layer (typically a microelectronics dielectric layer) to underlying microelectronics structures of different depths beneath the microelectronics layer, without overetching the microelectronics structures formed at a limited depth beneath the microelectronics layer. To realize the foregoing object, there is employed a sequential and partial development of the photoexposed blanket photoresist layer such that a first series of vias extending to lower lying microelectronics structures beneath the microelectronics layer may be at least partially etched prior to completely etching the first series of vias extending to the lower lying microelectronics structures beneath the microelectronic layer in conjunction with simultaneous etching of a second series of vias extending to the upper lying microelectronics structures of limited depth beneath the microelectronics layer.

Finally, Nogami, in U.S. Pat. No. 5,763,324, discloses a method for forming within a microelectronic fabrication, with improved uniformity across a substrate employed within the microelectronic fabrication, a series of etchback planar conductor stud layers within a series of vias through a dielectric layer employed within the microelectronics fabrication. To realize that object, there is employed when etchback planarizing the series of conductor stud layers within the series of vias through the dielectric layer within the microelectronic fabrication a series of at least two sacrificial etch back planarizing photoresist layers rather than a single sacrificial etchback planarizing photoresist layer.

Desirable in the art of microelectronics fabrication are additional methods and materials which may be employed for forming within microelectronic fabrications microelectronic device structures and patterned microelectronic layers while avoiding the use of advanced microelectronic fabrication photolithographic tooling when forming the microelectronic device structures and patterned microelectronics layers within the microelectronic fabrications.

It is towards that goal that the present invention is directed.

SUMMARY OF THE INVENTION

A first object of the present invention is to provide a method for forming a microelectronic device structure within a microelectronic fabrication.

A second object of the present invention is to provide a method for forming a patterned microelectronic layer within a microelectronic fabrication.

A third object of the present invention is to provide a method in accord with the first object of the present invention or the second object of the present invention, where there is avoided use of advanced microelectronic fabrication photolithographic tooling when forming the microelectronic device structure or patterned microelectronic layer within the microelectronic fabrication.

A fourth object of the present invention is to provide a method in accord with the first object of the present invention, the second object of the present invention or the third object of the present invention, which method is readily commercially implemented.

In accord with the objects of the present invention, there is provided by the present invention a method for fabricating a microelectronic layer for use within a microelectronic fabrication. To practice the method of the present invention, there is first provided a substrate. There is then formed over the substrate a target layer. There is then formed upon the target layer a patterned photoresist layer which defines a first aperture. The first aperture has a first aperture width which exposes a first portion of the target layer. There is then reflowed thermally the patterned photoresist layer to form a reflowed patterned photoresist layer which defines a substantially straight sided second aperture. The second aperture has a second aperture width less than the first aperture width, and the second aperture thus exposes a second portion of the blanket target layer of areal dimension less than the first portion of the blanket target layer. Finally, there is then fabricated the target layer to form a fabricated target layer while employing the reflowed patterned photoresist layer as a mask layer.

There is provided by the present invention a method for forming a microelectronic device structure or a patterned microelectronic layer within a microelectronic fabrication, where there is avoided use of advanced microelectronic fabrication photolithographic tooling when forming the microelectronic device structure or patterned microelectronic layer within the microelectronic fabrication. The method of the present invention realizes the foregoing object by employing when forming the microelectronic device structure or patterned microelectronic layer while fabricating a target layer formed beneath a patterned photoresist layer within the microelectronic fabrication a thermal reflow processing of the patterned photoresist layer, which has a first aperture defined by a first aperture width, to form a reflowed patterned photoresist layer having a second aperture defined by a second aperture width less than the first aperture width. The reflowed patterned photoresist layer is then employed for fabricating the target layer. Since the second aperture width is defined as less than the first aperture width while employing a thermal reflow process, there may be avoided when: (1) forming the patterned photoresist layer; (2) forming the reflowed patterned photoresist layer; and (3) fabricating the target layer, advanced microelectronic fabrication photolithographic tooling.

The method of the present invention is readily commercially implemented. The method of the present invention may be practiced employing photoresist materials and thermal reflow annealing methods as are generally known in the art of microelectronics fabrication. Since it is a process control and materials selection which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for forming a microelectronic device structure or a patterned microelectronic layer within a microelectronic fabrication, where there is avoided use of advanced microelectronic fabrication photolithographic tooling when forming the microelectronic device structure or patterned microelectronic layer within the microelectronic fabrication. The method of the present invention realizes the foregoing object by employing when forming the microelectronic device structure or patterned microelectronic layer while fabricating a target layer formed beneath a patterned photoresist layer within the microelectronic fabrication a thermal reflow process of the patterned photoresist layer, which has a first aperture defined by a first aperture width, to form a reflowed patterned photoresist layer having a second aperture defined by a second aperture width less than the first aperture width. The reflowed patterned photoresist layer is then employed for fabricating the target layer. Since the second aperture width is defined as less than the first aperture width while employing a thermal reflow process, there may be avoided when: (1) forming the patterned photoresist layer; (2) forming the reflowed patterned photoresist layer; and (3) fabricating the target layer, advanced microelectronic fabrication photolithographic tooling.

The method of the present may be employed in forming microelectronic device structures and patterned microelectronic layers within microelectronic fabrications including but not limited to semiconductor integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Similarly, although the preferred embodiment of the present invention illustrates the present invention within the context of forming a patterned microelectronics layer within a microelectronics fabrication while avoiding the use of advanced microelectronic fabrication photolithographic tooling, the method of the present invention may also be employed for fabricating microelectronics layers while employing microelectronic layer fabrication methods including but not limited to microelectronics layer etch fabrication methods, microelectronic layer ion implant fabrication methods and microelectronic layer deposition fabrication methods.

Figure 1:
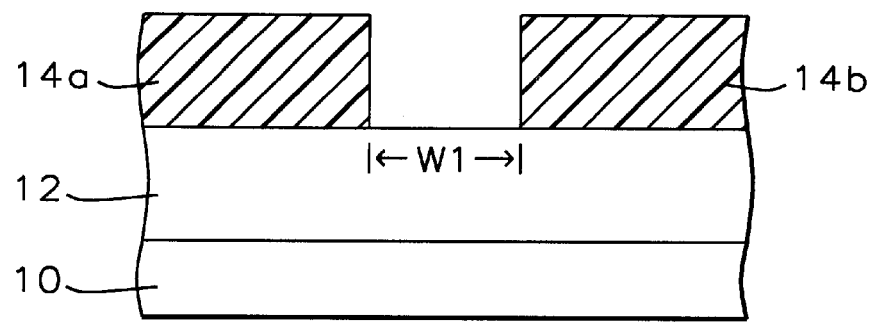
FIG. 1, FIG. 2 and FIG. 3 show a series of schematic cross-sectional diagrams illustrating the results of forming, in accord with a preferred embodiment of the present invention, a patterned microelectronics layer within a microelectronic fabrication.
Figure 2:
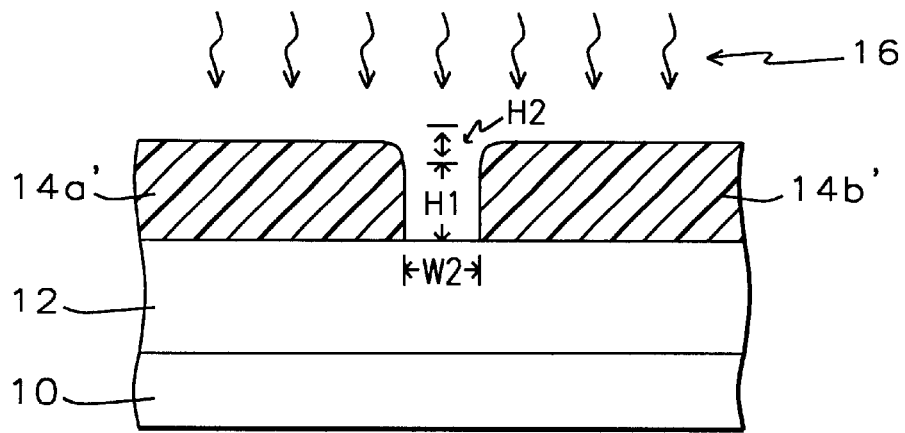
Figure 3:
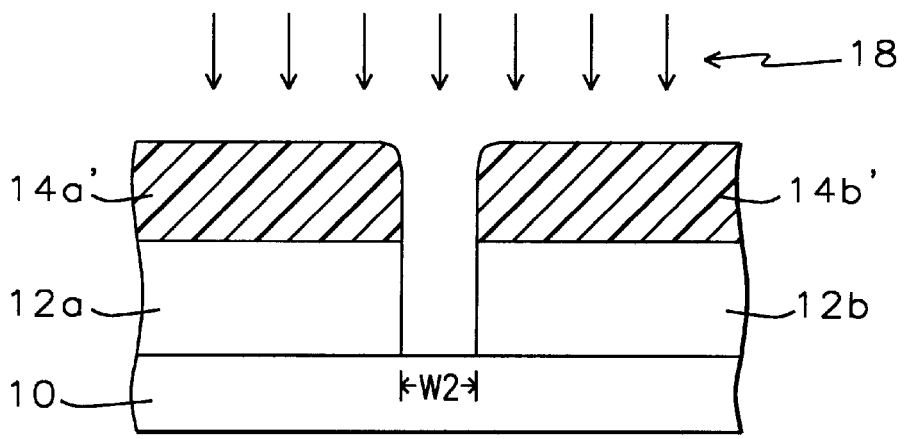

Referring now to FIG. 1 to FIG. 3, there is shown a series of schematic cross, sectional diagrams illustrating the results of progressive stages in forming a pair of patterned target layers within a microelectronics fabrication from a blanket target layer formed within the microelectronic fabrication, in accord with the present invention. Shown in FIG. 1 is a schematic cross-sectional diagram of the microelectronic fabrication at an early stage in its fabrication in accord with the present invention.

Shown in FIG. 1 is a substrate 10 having formed thereover a blanket target layer 12 which in turn has formed thereupon a pair of patterned photoresist layers 14a and 14b. Within the preferred embodiment of the present invention with respect to the substrate 10, the substrate 10 may be a substrate employed within a microelectronic fabrication selected from a group including but not limited to semiconductor integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications. Although not specifically illustrated within the schematic cross sectional diagram of FIG. 1, the substrate 10 may be the substrate alone employed within the microelectronic fabrication, or in the alternative, the substrate 10 may be the substrate employed within the microelectronic fabrication, where the substrate has formed thereupon or thereover, and thus incorporated therein, any of several additional layers which may conventionally be employed within the microelectronic fabrication within which is employed the substrate. Such additional layers may be formed of microelectronic materials including but not limited to microelectronic conductor materials, microelectronic semiconductor materials and microelectronic dielectric materials.

Similarly, although also not specifically illustrated within the schematic cross sectional diagram of FIG. 1, the substrate 10 may have formed therein or thereupon microelectronic devices as are appropriate for the microelectronic fabrication within which is employed the substrate 10. Such microelectronic devices may include, but are not limited to transistors, resistors, diodes and capacitors.

Within the preferred embodiment of the present invention with respect to the blanket target layer 12, the blanket target layer may, similarly with additional layers which may be formed upon or over the substrate 10, and thus incorporated into the substrate 10, be formed of a material selected from the group consisting of microelectronic conductor materials, microelectronic semiconductor materials and microelectronic dielectric materials. The nature and selection of the material from which is formed the blanket target layer 12 will typically and preferably be guided by the nature of additional processing of the blanket target layer 12 when fabricating the blanket target layer 12 for use within the microelectronic fabrication within which is formed the blanket target layer 12. For example and without limitation, a blanket target layer 12 through which it is desired to form a via while employing a microelectronic layer etch method might typically and more preferably, although not exclusively, be formed of a microelectronic dielectric material. Similarly, also for example and without limitation, a blanket target layer 12 into which it is desired to form an ion implant structure might typically and more preferably, although not exclusively, be formed of a microelectronic semiconductor material. Finally, also for example and without limitation, a blanket target layer 12 upon which it is desired to form microelectronic conductor structure employing a deposition method, such as but not limited to a vapor deposition method or a plating deposition method might typically and more preferably, although not exclusively, be formed of a microelectronic conductor material. Typically and preferably, the blanket target layer 12 is formed to a thickness of from about 500 to about 30000 angstroms.

Finally, within the preferred embodiment of the present invention with respect to the pair of patterned photoresist layers 14a and 14b, while the pair of patterned photoresist layers 14a and 14b may in general be formed from any of several photoresist materials as are known in the art of microelectronic fabrication, such photoresist materials being selected from the general groups of photoresist materials including but not limited to positive photoresist materials and negative photoresist materials, within the preferred embodiment of the present invention the pair of patterned photoresist layers 14a and 14b is formed of a photoresist material which upon thermal reflow forms a pair of reflowed patterned photoresist layers with substantially straight sidewalls upon the blanket target layer 12. While many photoresist materials from which may be formed the pair of patterned photoresist layers 14a and 14b do not inherently possess this characteristic and instead form upon thermal reflow reflowed patterned photoresist layers with either severely sloped sidewalls or which require additional processing, such as ultraviolet irradiation processing, to form thermal reflow reflowed patterned photoresist layers with straighter sided sidewalls which are still not substantially straight sidewalls within the context of the present invention, it has been determined experimentally that certain types of photoresist materials do possess the property that upon thermal reflow they form thermal reflowed patterned photoresist layers with substantially straight sidewalls, in absence of any additional processing, such as but not limited to ultraviolet irradiation processing. In particular, the ability to form thermal reflowed patterned photoresist layers with substantially straight sidewalls without any additional process beyond thermal reflow processing has been observed for patterned photoresist layers formed employing deep ultraviolet (DUV) positive photoresist materials which employ a polymethylmethacrylate (PMMA) polymer material.

Preferably, the patterned photoresist layers 14a and 14b are formed to a thickness of from about 5000 to about 12000 angstroms while employing such a deep ultraviolet (DUV) positive polymethylmethacrylate (PMMA) polymer photoresist material to form, as illustrated within the schematic cross-sectional diagram of FIG. 1, a first aperture of width WI from about 0.30 to about 0.50 microns which leaves exposed a first portion of the blanket target layer 12.

Referring now to FIG. 2, there is shown a schematic cross-sectional diagram illustrating the results of further processing of the microelectronic fabrication whose schematic cross-sectional diagram is illustrated in FIG. 1. Shown in FIG. 2 is a schematic cross-sectional diagram of a microelectronic fabrication otherwise equivalent to the microelectronic fabrication whose schematic cross-sectional diagram is illustrated in FIG. 1, but wherein the par of patterned photoresist layers 14 and 14b has been thermally annealed within a thermal exposure 16 to form a pair of thermally reflowed patterned photoresist layers 14a' and 14b'. Within the preferred embodiment of the present invention when the patterned photoresist layers 14a and 14b are formed of the preferred deep ultraviolet (DUV) positive polymethylmethacrylate (PMMA) polymer photoresist material, the thermal exposure 16 will typically and preferably be undertaken at a temperature of from about 100 to about 150 degrees centigrade for a time period of from about 50 to about 180 seconds minutes within a conventional thermal annealing oven, although other thermal annealing methods may also be employed for providing the thermal exposure 16.

As is illustrated within the schematic cross-sectional diagram of FIG. 2, the reflowed patterned photoresist layers 14a' and 14b' define a second aperture of width W2, where the second aperture typically and preferably has a second aperture width of from about 0.15 to about 0.30 microns which leaves exposed a second portion of the blanket target layer 12. Thus, within the preferred embodiment of the present invention, the second portion of the blanket target layer 12 is smaller than, and typically contained within, the first portion of the blanket target layer 12.

As is similarly also illustrated within the schematic cross-sectional diagram of FIG. 2, each reflowed patterned photoresist layer 14a' or 14b' within the pair of reflowed patterned photoresist layers 14a' and 14b' is formed with substantially straight sidewalls. Within the context of the present invention and the preferred embodiment of the present invention, a substantially straight sidewall of a reflowed patterned photoresist layer, such as a reflowed patterned photoresist layer 14a' or 14b' within the pair of reflowed patterned photoresist layers 14a' and 14b', is intended as indicating that the reflowed patterned photoresist layer has a sidewall slope of greater than about 85 degrees, more preferably from about 85 to about 90 degrees. Similarly, although as illustrated within the schematic cross-sectional diagram of FIG. 2 there will typically and preferably exist some rounding at the upper edges of the reflowed patterned photoresist layers 14a' and 14b' incident to thermal reflow processing of the patterned photoresist layers 14a and 14b when forming the thermally reflowed patterned photoresist layers 14a' and 14b', such rounding at the upper edges is typically and preferably negligible. In that regard, such rounding typically and preferably occurs within a depth H2 of from about 1000 to about 3000 angstroms within an upper portion of the reflowed patterned photoresist layers 14a' and 14b', while the substantially straight sided portions of the reflowed patterned photoresist layers 14a' and 14b' typically and preferably include a depth H1 of from about 4000 to about 9000 angstroms including a bottom portion of the thickness of the reflowed patterned photoresist layers 14a' and 14b'.

Referring now to FIG. 3, there is shown a schematic cross-sectional diagram illustrating the results of further processing of the microelectronic fabrication whose schematic cross-sectional diagram is illustrated in FIG. 2. Shown in FIG. 3 is a schematic cross-sectional diagram of a microelectronic fabrication otherwise equivalent to the microelectronic fabrication whose schematic cross-sectional diagram is illustrated in FIG. 2, but wherein the blanket target layer 12 has been patterned to form a pair of patterned target layers 12a and 12b while employing an etching plasma 18, in conjunction with the pair of thermally reflowed patterned photoresist layers 14a' and 14b' as an etch mask layer.

Within the preferred embodiment of the present invention, an etching gas composition and operating parameters employed within the etching plasma 18 are selected within the context of the microelectronic material from which is formed the blanket target layer 12. For the preferred embodiment of the present invention when the blanket target layer 12 is formed of a microelectronic dielectric material, such as but not limited to a silicon oxide dielectric material, a silicon nitride dielectric material or a silicon oxynitride dielectric material, the etching plasma 18 preferably employs an etchant gas composition which upon plasma activation forms an active fluorine containing etchant species. As is illustrated within the schematic cross-sectional diagram of FIG. 3, the etching plasma 18 may typically and preferably be employed to anisotropically form a via defined by the patterned target layers 12a and 12b, where the via also has an aperture width W2 corresponding with the second aperture width W2 defined by the pair of thermally reflowed patterned photoresist layers 14a' and 14b' as is illustrated within the schematic cross-sectional diagram of FIG. 2.

Upon forming the microelectronic fabrication whose schematic cross-sectional diagram is illustrated in FIG. 3, there is formed a microelectronic fabrication having formed therein a patterned microelectronic layer defining a via of decreased aperture width without employing advanced microelectronic fabrication photolithographic tooling when forming a patterned photoresist layer which is employed as an etch mask layer for forming the patterned microelectronic layer. The method of the present invention realizes the foregoing object by employing as an etch mask layer when forming the patterned microelectronic layer a thermally reflowed patterned photoresist layer having substantially straight sidewalls, where the thermally reflowed patterned photoresist layer defines a second aperture having a second aperture width less than a first aperture width of a patterned photoresist layer from which is formed the thermally reflowed patterned photoresist layer.

As is understood by a person skilled in the art, although the preferred embodiment of the present invention illustrates the present invention within the context of forming a pair of patterned target layers 12a and 12b from a blanket target layer 12 while employing a pair of reflowed patterned photoresist layers 14a' and 14b' as an etch mask layer to provide a via defined by the pair of patterned target layers 12a and 12b of narrower aperture width than a first aperture defined by a pair of patterned photoresist layers from which is formed the pair of reflowed patterned photoresist layers, the method of the present invention is, as noted above, not exclusively limited to forming within a microelectronic fabrication a patterned microelectronic layer which defines a via of an aperture width less an aperture width of a patterned photoresist layer which is employed for forming the patterned microelectronic layer. In that regard, and as is similarly noted above, the method of the present invention may also be employed for fabricating microelectronic layers employing microelectronic layer fabrication methods including but not limited to microelectronic layer etch fabrication methods, microelectronic layer ion implant fabrication methods and microelectronic layer deposition fabrication methods, which in turn may include, but are not limited to microelectronic layer vapor deposition fabrication methods and microelectronic layer plating deposition fabrication methods.

EXAMPLE

There was obtained a series of three (100) silicon semiconductor substrates and formed upon each silicon semiconductor substrate within the series of three (100) silicon semiconductor substrates a blanket silicon oxide layer of thickens about 15000 angstroms while employing a plasma enhanced chemical vapor deposition (PECVD) method which in turn employed tetraethylorthosilicate (TEOS) as a silicon source material. Upon each blanket silicon oxide layer was then formed a blanket photoresist layer formed of a deep ultraviolet (DUV) positive Polymethylmethacrylate (PMMA) polymer photoresist material available from Sumitomo Chemical Co.

Each of the three blanket photoresist layers was then photoexposed and developed, while employing methods as are conventional in the art of microelectronic fabrication, to form a corresponding series of three patterned photoresist layers each one of which defined a series of first circular apertures of nominal first aperture width about 0.30 microns. At this point in the processing of the three (100) silicon semiconductor substrates one of the three (100) silicon semiconductor substrates was removed and a series of first aperture widths and tapers of the series of first circular apertures defined by the patterned photoresist layer was measured while employing a scanning electron microscopy (SEM) cross-section measurement method as is conventional in the art of microelectronic fabrication.

The blanket photoresist layers on the remaining two (100) silicon semiconductor substrates were then thermally reflowed at a temperature of about 125 degrees centigrade for a time period of about 120 seconds while employing a conventional thermal annealing furnace. At this point in the processing of the remaining two (100) silicon semiconductor substrates, one of the two remaining (100) silicon semiconductor substrates was then removed and a series of second aperture widths and tapers of a series of second apertures defined by the reflowed patterned photoresist layer was measured employing the scanning electron microscopy (SEM) cross-section measurement method as is conventional in the art of microelectronic fabrication.

The blanket silicon oxide layer on the remaining (100) silicon semiconductor substrate was then etched employing a reactive ion etch (RIE) plasma etch method employing an etchant gas composition comprising carbon tetrafluoride, trifluoromethane and argon to form a series of vias through the blanket silicon oxide layer, while employing the reflowed patterned photoresist layer as an etch mask layer. The reactive ion etch (RIE) plasma etch method also employed: (1) a reactor chamber pressure of about 100 mtorr, (2) a source radio frequency power of about 950 watts at a source radio frequency of 13.56 MHZ; (3) a silicon semiconductor substrate temperature of about 25 degrees centigrade; (5) a flow rate of about 45 standard cubic centimeters per minute (sccm); (6) a trifluoromethane flow rate of about 45 standard cubic centimeters per minute (sccm); and (7) an argon flow rate of about 200 standard cubic centimeters per minute (sccm).

The series of vias through the blanket silicon oxide layer on the third (100) silicon semiconductor substrate were then measured for aperture width and taper employing the scanning electron microscopy (SEM) cross-section measurement method as is conventional in the art of microelectronic fabrication.

The results of the scanning electron microscopy (SEM) cross-section measurement method measurements of aperture width and taper of: (1) the patterned photoresist layer; (2) the reflowed patterned photoresist layer; and (3) the patterned silicon oxide layer, as discussed above, are reported in Table I, as follows.

TABLE I

| Patterned P/R Layer | | Reflowed P/R Layer | | Patterned SiOx Layer | |
| --- | --- | --- | --- | --- | --- |
| Apt' width (microns) | Taper (deg) | Apt' width (microns) | Taper (deg) | Apt' width (microns) | Taper (deg) |
| 0.32 +/− 0.03 | 88 +/− 2 | 0.18 +/− 0.02 | 88 +/− 2 | 0.20 +/− 0.02 | 87 +/− 2 |

As is seen from review of the data within Table I, there may be formed employing the method of the present invention a reflowed patterned photoresist layer which defines a series of second apertures of second aperture width less than a first aperture width of a series of first apertures defined by a patterned photoresist layer from which is formed the reflowed patterned photoresist layer. The reflowed patterned photoresist layer may be formed with sufficiently substantially straight sidewalls such that the reflowed patterned photoresist layer may be employed, without further processing, such as but not limited to ultraviolet exposure processing, to serve as an etch mask layer for forming a series of vias through a target layer formed beneath the reflowed patterned photoresist layer. Thus, the series of vias so formed may be of a diminished dimension such as is typically conventionally obtained while employing advanced microelectronic fabrication photolithographic tooling when forming the patterned photoresist layer, while not in fact employing advanced microelectronic fabrication photolithographic tooling when forming the patterned photoresist layer.

As is understood by a person skilled in the art, the preferred embodiment and example of the present invention are illustrative of the present invention rather than limiting of the present invention. Revisions and modifications may be made to methods, materials, structures and dimensions which are employed when fabricating microelectronic fabrications in accord with the preferred embodiment and example of the present invention, while still providing microelectronic fabrications in accord with the spirit and scope of the present invention, as defined by the appended claims.

What is claimed is:

1. A method for fabricating a microelectronic layer comprising:

providing a substrate;

forming over the substrate a blanket target layer;

forming upon the blanket target layer a patterned photoresist layer which defines a first aperture, the first aperture having a first aperture width which exposes a first portion of the blanket target layer;

reflowing thermally the patterned photoresist layer at from about 100 to 150° C. for from about 50 to 180 seconds to form a reflowed patterned photoresist layer which defines a substantially straight sided second aperture, the straight sides being substantially vertical with a slope greater than about 85° the second aperture having a second aperture width less than the first aperture width, the second aperture thus exposing a second portion of the blanket target layer of areal dimension less than the first portion of the blanket target layer; and fabricating the target layer to form a fabricated target layer while employing the reflowed patterned photoresist layer as a mask layer.

2. The method of claim 1 wherein the reflowed patterned photoresist layer is not treated with an ultraviolet irradiation treatment prior to fabricating the blanket target layer to form the fabricated target layer while employing the reflowed patterned photoresist layer as the mask layer.

3. The method of claim 1 wherein the substrate is employed within a microelectronic fabrication selected from the group consisting of semiconductor integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

4. The method of claim 1 wherein the target layer is selected from the group consisting of conductor target layers, semiconductor target layers and dielectric target layers.

5. The method of claim 1 wherein the target layer is fabricated employing a microelectronic layer fabrication method selected from the group consisting of microelectronic layer etch fabrication methods, microelectronic layer ion implant fabrication methods and microelectronic layer deposition fabrication methods.

6. The method of claim 1 wherein the patterned photoresist layer is formed of a deep ultraviolet (DUV) positive polymethylmethacrylate (PMMA) photoresist material.

7. The method of claim 1, wherein the first aperture width is from about 0.3 to 0.5 microns and the second aperture width is from about 0.15 to 0.3 microns.

8. The method of claim 1, wherein the patterned photoresist layer is from about 5000 to 12,000 Å thick and is formed of a deep ultraviolet (DUV) positive polymethylmethacrylate (PMMA) photoresist material.

9. The method of claim 1, wherein the first aperture width is from about 0.3 to 0.5 microns and the second aperture width is from about 0.15 to 0.3 microns; and the patterned photoresist layer is from about 5000 to 12,000 Å thick and is formed of a deep ultraviolet (DUV) positive polymethylmethacrylate (PMMA) photoresist material.

10. The method of claim 1, wherein the patterned photoresist layer is thermally reflowed at about 125° C. for about 120 seconds.

11. The method of claim 1, wherein the blanket target layer has a thickness of from about 500 to 30,000 Å.

12. A method for fabricating a microelectronic layer comprising:

providing a substrate;

forming over the substrate a blanket target layer;

forming upon the blanket target layer a patterned DUV PMMA photoresist layer which defines a first aperture, the first aperture having a first aperture width of from about 0.3 to 0.5 microns which exposes a first portion of the blanket target layer;

reflowing thermally the patterned DUV PMMA photoresist layer at from about 100 to 150° C. for from about 50 to 180 seconds to form a reflowed patterned photoresist layer which defines a substantially straight sided second aperture, the straight sides being substantially vertical with a slope greater than about 85°, the second aperture having a second aperture width of from about 0.15 to 0.3 microns and less than the first aperture width, the second aperture thus exposing a second portion of the blanket target layer of areal dimension less than the first portion of the blanket target layer; and fabricating the blanket target layer to form a fabricated target layer while employing the reflowed patterned photoresist layer as a mask layer.

13. The method of claim 12 wherein the reflowed patterned photoresist layer is not treated with an ultraviolet irradiation treatment prior to fabricating the blanket target layer to form the fabricated target layer while employing the reflowed patterned photoresist layer as the mask layer.

14. The method of claim 12 wherein the substrate is employed within a microelectronic fabrication selected from the group consisting of semiconductor integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

15. The method of claim 12 wherein the blanket target layer is selected from the group consisting of conductor target layers, semiconductor target layers and dielectric target layers.

16. The method of claim 12 wherein the blanket target layer is fabricated employing a microelectronic layer fabrication method selected from the group consisting of microelectronic layer etch fabrication methods, microelectronic layer ion implant fabrication methods and microelectronic layer deposition fabrication methods.

17. The method of claim 12, wherein the patterned DUV PMMA photoresist layer is from about 5000 to 12,000 Å thick.

18. The method of claim 12 wherein the patterned DUV PMMA photoresist layer is thermally reflowed at about 125° C. for about 120 seconds.

19. The method of claim 12, wherein the blanket target layer has a thickness of from about 500 to 30,000 Å.

20. A method for fabricating a microelectronic layer comprising:

providing a substrate;

forming over the substrate a blanket target layer;

forming upon the blanket target layer a patterned DUV PMMA photoresist layer which defines a first aperture, the first aperture having a first aperture width of from about 0.3 to 0.5 microns which exposes a first portion of the blanket target layer;

reflowing thermally the patterned DUV PMMA photoresist layer at from about 100 to 150° C. for from about 50 to 180 seconds to form a reflowed patterned DUV PMMA photoresist layer which defines a substantially straight sided second aperture, the straight sides being substantially vertical with a slope greater than about 85°, the second aperture having a second aperture width of from about 0.15 to 0.3 microns and less than the first aperture width, the second aperture thus exposing a second portion of the blanket target layer of areal dimension less than the first portion of the blanket target layer; and fabricating the blanket target layer to form a fabricated target layer while employing the reflowed patterned DUV PMMA photoresist layer as a mask layer; the reflowed patterned DUV PMMA photoresist layer not being treated with an ultraviolet irradiation treatment prior to fabricating the blanket target layer to form the fabricated target layer while employing the reflowed patterned DUV PMMA photoresist layer as the mask layer.

21. The method of claim 20, wherein the substrate is employed within a microelectronic fabrication selected from the group consisting of semiconductor integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

22. The method of claim 20, wherein the blanket target layer is selected from the group consisting of conductor target layers, semiconductor target layers and dielectric target layers.

23. The method of claim 20, wherein the blanket target layer is fabricated employing a microelectronic layer fabrication method selected from the group consisting of microelectronic layer etch fabrication methods, microelectronic layer ion implant fabrication methods and microelectronic layer deposition fabrication methods.

24. The method of claim 20, wherein the patterned DUV PMMA photoresist layer is from about 5000 to 12,000 Å thick.

25. The method of claim 20 wherein the patterned DUV PMMA photoresist is thermally reflowed at about 125° C. for about 120 seconds.

26. The method of claim 20, wherein the blanket target layer has a thickness of from about 500 to 30,000 Å.

27. A method for fabricating a microelectronic layer comprising:

provided a substrate;

forming over the substrate a blanket target layer;

forming upon the blanket target layer a patterned photoresist layer which defines a first aperture, the first aperture having a first aperture width which exposes a first portion of the blanket target layer;

reflowing thermally the patterned photoresist layer at from about 100 to 150° C. for from about 50 to 180 seconds to form a reflowed patterned photoresist layer which defines a substantially straight sided second aperture, the second aperture having a second aperture width less than the first aperture width, the second aperture thus exposing a second portion of the blanket target layer of areal dimension less than the first portion of the blanket target layer; and fabricating the blanket target layer to form a fabricated target layer while employing the reflowed patterned photoresist layer as a mask layer; wherein the fabrication of the fabricated target layer employs a reactive ion etch employing an etchant gas composition comprising carbon tetrafluoride, trifluoromethane and argon; a reactor chamber pressure of about 100 mTorr; a source radio frequency power of about 950 watts at a source radio frequency of 13.56 MHz; a silicon semiconductor substrate temperature of about 25 degrees centigrade; a carbon tetrafluoride flow rate of about 45 sccm; a trifluoromethane flow rate of about 45 sccm; and an argon flow rate of about 200 sccm.

28. The method of claim 27, wherein the reflowed patterned photoresist layer is not treated with an ultraviolet irradiation treatment prior to fabricating the blanket target layer to form the fabricated target layer while employing the reflowed patterned photoresist layer as the mask layer.

29. The method of claim 27, wherein the blanket target layer is selected from the group consisting of conductor target layers, semiconductor target layers and dielectric target layers.

30. The method of claim 27, wherein the patterned photoresist layer is formed of a deep ultraviolet (DUV) positive polymethylmethacrylate (PMMA) photoresist material.

31. The method of claim 27, wherein the first aperture width is from about 0.3 to 0.5 microns and the second aperture width is from about 0.15 to 0.3 microns.

32. The method of claim 27, wherein the patterned photoresist layer is from about 5000 to 12,000 Å thick and is formed of a deep ultraviolet (DUV) positive polymethylmethacrylate (PMMA) photoresist material.

33. The method of claim 27, wherein the first aperture width is from about 0.3 to 0.5 microns and the second aperture width is from about 0.15 to 0.3 microns; and the patterned photoresist layer is from about 5000 to 12,000 Å thick and is formed of a deep ultraviolet (DUV) positive polymethylmethacrylate (PMMA) photoresist material.

34. The method of claim 27, wherein the patterned photoresist layer is thermally reflowed at about 125° C. for about 120 seconds.

35. The method of claim 27, wherein the blanket target layer has a thickness of from about 500 to 30,000 Å.

36. A method for fabricating a microelectronic layer comprising:

providing a substrate;

forming over the substrate a blanket target layer;

forming upon the blanket target layer a patterned DUV PMMA photoresist layer which defines a first aperture, the first aperture having a first aperture width of from about 0.3 to 0.5 microns which exposes a first portion of the blanket target layer;

reflowing thermally the patterned DUV PMMA photoresist layer at from about 100 to 150° C. for from about 50 to 180 seconds to form a reflowed patterned photoresist layer which defines a substantially straight sided second aperture, the second aperture having a second aperture width of from about 0.15 to 0.3 microns and less than the first aperture width, the second aperture thus exposing a second portion of the blanket target layer of areal dimension less than the first portion of the blanket target layer; and fabricating the blanket target layer to form a fabricated target layer while employing the reflowed patterned photoresist layer as a mask layer; wherein the fabrication of the fabricated target layer employs a reactive ion etch employing an etchant gas composition comprising carbon tetrafluoride, trifluoromethane and argon; a reactor chamber pressure of about 100 mTorr; a source radio frequency power of about 950 watts at a source radio frequency of 13.56 MHz; a silicon semiconductor substrate temperature of about 25 degrees centigrade; a carbon tetrafluoride flow rate of about 45 sccm; a trifluoromethane flow rate of about 45 sccm; and an argon flow rate of about 200 sccm.

37. The method of claim 36 wherein the reflowed patterned photoresist layer is not treated with an ultraviolet irradiation treatment prior to fabricating the blanket target layer to form the fabricated target layer while employing the reflowed patterned photoresist layer as the mask layer.

38. The method of claim 36 wherein the blanket target layer is selected from the group consisting of conductor target layers, semiconductor target layers and dielectric target layers.

39. The method of claim 36, wherein the patterned DUV PMMA photoresist layer is from about 5000 to 12,000 Å thick.

40. The method of claim 36, wherein the patterned DUV PMMA photoresist layer is thermally reflowed at about 125° C. for about 120 seconds.

41. The method of claim 36, wherein the blanket target layer has a thickness of from about 500 to 30,000 Å.

42. A method for fabricating a microelectronic layer comprising:

providing a substrate;

forming over the substrate a blanket target layer;

forming upon the blanket target layer a patterned DUV PMMA photoresist layer which defines a first aperture, the first aperture having a first aperture width of from about 0.3 to 0.5 microns which exposes a first portion of the blanket target layer;

reflowing thermally the patterned DUV PMMA photoresist layer at from about 100 to 150° C. for from about 50 to 180 seconds to form a reflowed patterned photoresist layer which defines a substantially straight sided second aperture, the second aperture having a second aperture width of from about 0.15 to 0.3 microns and less than the first aperture width, the second aperture thus exposing a second portion of the blanket target layer of areal dimension less than the first portion of the blanket target layer; and fabricating the blanket target layer to form a fabricated target layer while employing the reflowed patterned photoresist layer as a mask layer; the reflowed patterned photoresist layer not being treated with an ultraviolet irradiation treatment prior to fabricating the blanket target-layer to form the fabricated target layer while employing the reflowed patterned photoresist layer as the mask layer; wherein the fabrication of the fabricated target layer employs a reactive ion etch employing an etchant gas composition comprising carbon tetrafluoride, trifluoromethane and argon; a reactor chamber pressure of about 100 mTorr; a source radio frequency power of about 950 watts at a source radio frequency of 13.56 MHz; a silicon semiconductor substrate temperature of about 25 degrees centigrade; a carbon tetrafluoride flow rate of about 45 sccm; a trifluoromethane flow rate of about 45 sccm; and an argon flow rate of about 200 sccm.

43. The method of claim 42, wherein the blanket target layer is selected from the group consisting of conductor target layers, semiconductor target layers and dielectric target layers.

44. The method of claim 42, wherein the patterned DUV PMMA photoresist layer is from about 5000 to 12,000 Å thick.

45. The method of claim 42, wherein the patterned DUV PMMA photoresist is thermally reflowed at about 125° C. for about 120 seconds.

46. The method of claim 42, wherein the blanket target layer has a thickness of from about 500 to 30,000 Å.

* * * * *